United States Patent [19]

Schomers

[11] Patent Number: 4,862,161
[45] Date of Patent: Aug. 29, 1989

[54] THREE-STAGE COUPLING ARRANGEMENT

[75] Inventor: Josef Schomers, Backnang, Fed. Rep. of Germany

[73] Assignee: ANT Nachrichtentechnik GmbH, Backnang, Fed. Rep. of Germany

[21] Appl. No.: 38,126

[22] Filed: Apr. 2, 1987

Related U.S. Application Data

[63] Continuation-in-part of Ser. No. 864,418, Jan. 24, 1986, Pat. No. 4,679,121.

[30] Foreign Application Priority Data

Apr. 3, 1986 [EP] European Pat. Off. ........ 86104544.1

[51] Int. Cl.[4] .............................................. H04Q 11/00
[52] U.S. Cl. ...................... 340/825.800; 340/825.010; 361/413
[58] Field of Search ..................... 340/825.8, 826, 827; 361/409, 410, 413, 414, 416, 393; 370/16, 58, 60; 371/8

[56] References Cited

U.S. PATENT DOCUMENTS

| | | | |
|---|---|---|---|
| 4,536,870 | 8/1985 | Bovo et al. ............................. | 370/16 |
| 4,654,842 | 3/1987 | Coraluppi et al. ..................... | 370/16 |
| 4,679,121 | 7/1987 | Schomers et al. ................... | 361/416 |

FOREIGN PATENT DOCUMENTS

| | | |
|---|---|---|
| 0191902 | 8/1986 | European Pat. Off. . |
| 2500939 | 7/1976 | Fed. Rep. of Germany . |
| 2542579 | 4/1977 | Fed. Rep. of Germany . |

OTHER PUBLICATIONS

*Commutation et Electronique, Nr. 49, Apr. 1975, Seiten 23-34, Paris, FR;* P. Voyer et al.: "Reseau de Connexion Pour Grands Centres Temporels".

Telcom Report, Band 6, No. 2, Apr. 1983, Seiten 63-68, Passau, DE; B. Schaffer "BIGFON-Vermittlungs-und Verteiltechnik".

The Bell System Technical Journal, vol. 32, 1953, pp. 406-424;-"A Study of Non-Blocking Switching Networks", Charles Clos, Oct. 30, 1952, Manuscript.

*Primary Examiner*—Donald J. Yusko
*Assistant Examiner*—Edwin C. Holloway, III
*Attorney, Agent, or Firm*—Spencer & Frank

[57] ABSTRACT

The present invention relates to a three-stage coupling arrangement for an electrical data exchange system in which coupling matrixes of all stages are constructed identically. The coupling matrixes are divided among two switchboards. The number of inputs of a coupling matrix is equal to the number of its outputs and the inputs and outputs of the first switchboard are connected with the identically numbered inputs and outputs, respectively, of the second switchboard.

11 Claims, 15 Drawing Sheets

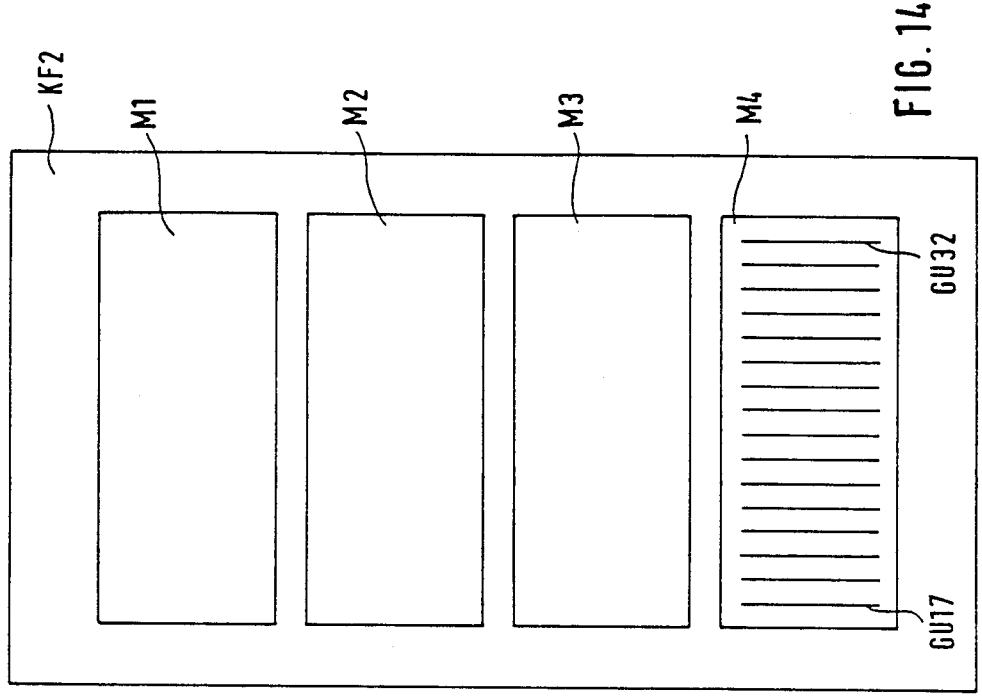
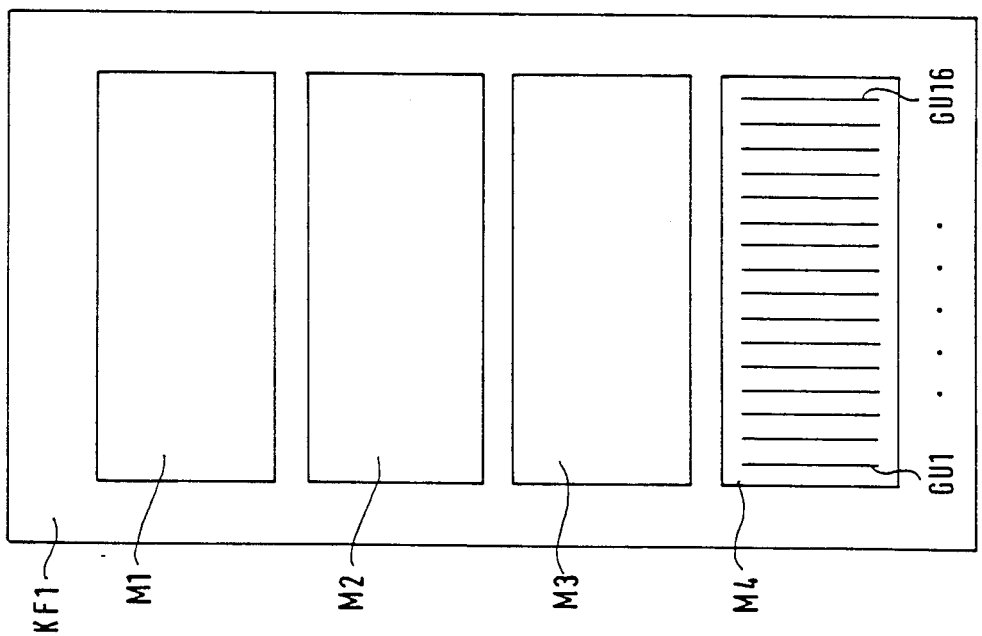

THREE-STAGE COUPLING ARRANGEMENT

CROSS-REFERENCE TO RELATED APPLICATION

This is a continuation-in-part of U.S. Ser. No. 06/864,418, filed Jan. 24th, 1986, now U.S. Pat. No. 4,679,121, the disclosure of which is incorporated herein by reference

BACKGROUND OF THE INVENTION

The present invention relates to a three-stage coupling arrangement for an electrical data exchange system including first, second and third stages, each stage comprising a plurality of coupling matrixes each of which has inputs and outputs and a matrix of switching points for selectively switching through signals from the inputs to respective outputs; and intermediate conductors for connecting the outputs of the coupling matrixes of one stage with the inputs of the coupling matrixes of a next stage; wherein the inputs of the coupling matrixes of the first stage constitute the inputs of the coupling arrangement and the outputs of the coupling matrixes of the third stage constitute the outputs of the coupling arrangement.

Coupling arrangements are used to selectively connect signal sources with signal drains. There are single-stage coupling arrangements and multi-stage coupling arrangements. A three-stage coupling arrangement is disclosed in an article by Charles Clos, entitled, "A Study of Non-Blocking Switching Networks", in the *The Bell System Technical Journal*, Volume XXXII 1953, pages 406–424.

The coupling arrangement shown in FIG. 2 of that article has a first stage, stage (a), a second stage, stage (b), and a third stage, stage (c). Each stage is composed of a plurality of coupling matrixes. The coupling matrixes of one stage differ in the number of their inputs and outputs from those of the other stages. For example, the coupling matrix of the first stage has six inputs and eleven outputs, the coupling matrix of the second stage has six inputs and six outputs and the coupling matrix of the third stage has eleven inputs and six outputs. Thus, three different embodiments of coupling matrixes are required. The number of embodiments is reduced to two if the switching points employ switching means which permit signal transmission in both directions, as is the case, for example, for metal contacts. In such a case, the embodiment provided for the first stage can also be used for the third stage with the inputs and outputs exchanged.

This coupling arrangement is non-blocking. That is, for every possible combination of already existing connections between a signal source and a signal drain every additional connection which is appropriate merely on the basis of the still available inputs and outputs can indeed be switched through. This is possible without a requirement for so called "recoupling" also called "rearrangement".

SUMMARY OF THE INVENTION

It is an object of the present invention to provide a coupling arrangement of the above-mentioned type in which the coupling matrixes of all stages have the same configuration.

The above and other objects are accomplished in the context of a three stage coupling arrangement for an electrical data exchange system of the type first described above, wherein the arrangement additionally includes: first and second identical three-stage switchboards between which the coupling matrixes are distributed, each stage of each switchboard having the same number of coupling matrixes, each coupling matrix having a number of inputs equal to its number of outputs, each one of the inputs of the coupling matrixes of the first stage of each respective switchboard constituting one of the inputs of that switchboard, each one of the outputs of the coupling matrixes of the third stage of each respective switchboard constituting one of the outputs of that switchboard, the inputs of the first switchboard being positioned in an identical numbered sequence as the inputs of the second switchboard, the outputs of the first switchboard being positioned in an identical numbered sequence as the outputs of the second switchboard, each input of the first switchboard being connected with the identically numbered input of the second switchboard, and each output of the first switchboard being connected with an identically numbered output of the second switchboard; and further including:

a common control means connected with each of the first and second switchboards for producing addresses identifying switching points to be switched through, each address including a designation of: the row and column of a switching point within a coupling matrix; the number of a coupling matrix within a stage; and the number of a stage within a switchboard; the control means further having two outputs and producing at such outputs respective switchboard addresses identifying a respective one of the first and second switchboards;

lines connected in parallel between the control means and the inputs of the first and second switchboards for carrying switching point addresses to both switchboards; and two individual lines each leading from a respective one of the two switchboard outputs of the control means to a respective one of the switchboards for carrying a corresponding switchboard address to that switchboard.

The connection of each input and output of a first coupling field (switchboard) with an input or output, respectively, of a second coupling field (switchboard) is known per se from the German periodical "Unterrichtsblätter der Deutschen Bundespost" [Instructional Sheets From the German Federal Postal Service], Volume 33/1980, No. 12, page 475, FIG. 13. However, the parallel connection of coupling fields realized in this manner is limited to two stages of a four-stage coupling arrangement.

BRIEF DESCRIPTION OF THE DRAWINGS

The present invention will be described with reference to the drawings, wherein:

FIG. 14 is a schematic showing the structural relationship of two switchboards KF1 and KF2 each including magazines M1 and M3 along with a fourth magazine M4 comprised of switching matrices of the type shown in FIG. 13.

DESCRIPTION OF THE PREFERRED EMBODIMENT

Figure 1:
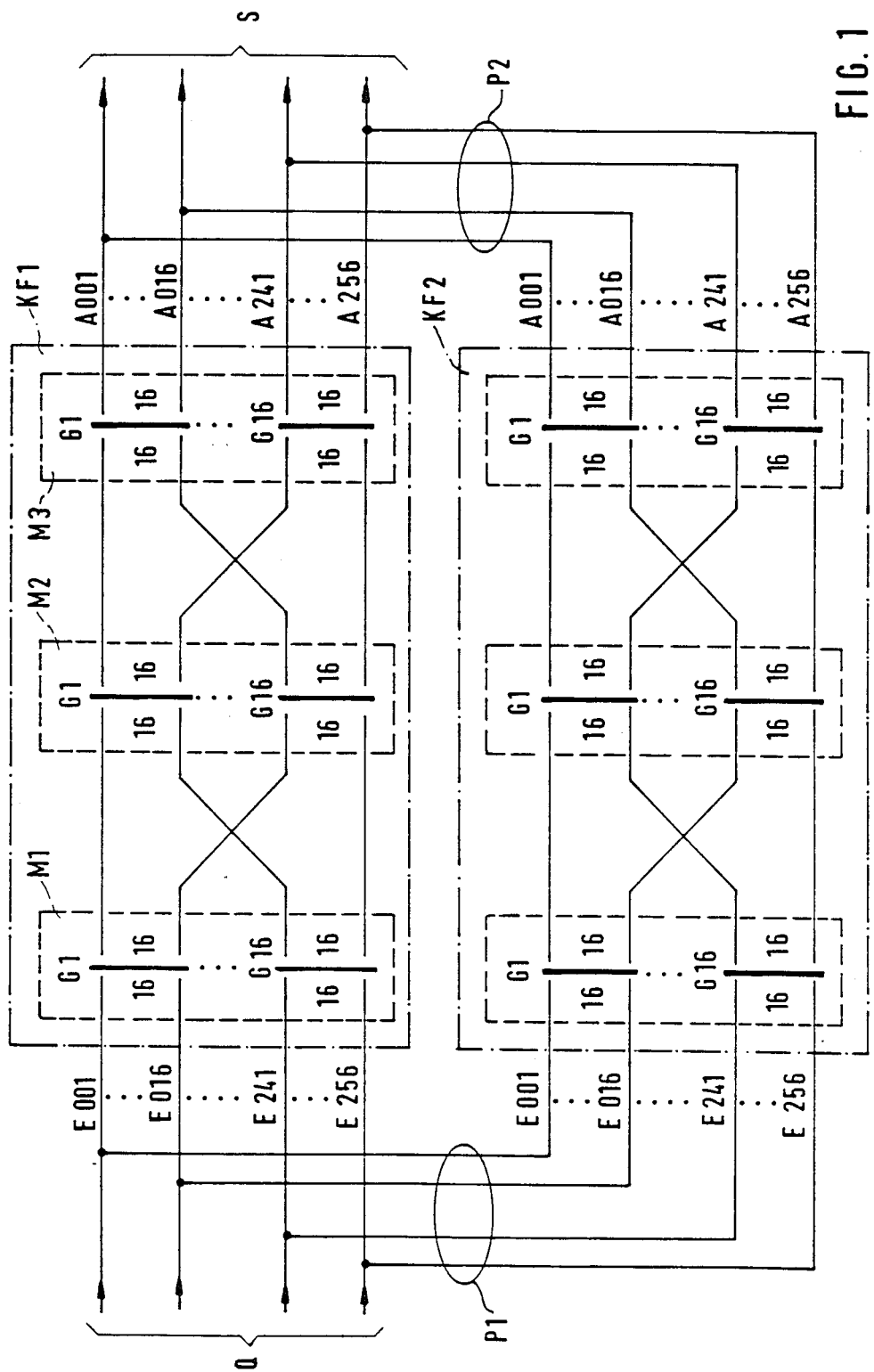
FIG. 1 is a block circuit diagram of a coupling arrangement to the invention.

Referring to FIG. 1, there is shown a coupling arrangement composed of a first coupling field KF1 and a second, identical coupling field KF2. Each coupling field is composed of a first stage M1, a second stage M2 and a third stage M3, i.e. each coupling field is composed of three stages. Each stage has 16 identical coupling matrixes G1 to G16, with each coupling matrix having 16 inputs and 16 outputs.

Each input of a coupling matrix of the first stage is an input of the respective coupling field. For 16 coupling matrixes G1 to G16 each having 16 inputs, there results 256 inputs E001 to E256 for each coupling field KF1 and KF2, respectively. In the same manner, the outputs of the coupling matrixes of the third stage of each coupling field form 256 outputs A001 to A256.

By way of a first parallel wire connection P1, each one of the inputs E001 to E256 of the first coupling field KF1 is connected with the identically numbered input of the second coupling field KF2. Outputs A001 to A256 are connected in the same manner, by way of a second parallel wire connection P2. In this way, the two coupling fields KF1 and KF2 are connected in parallel. Additionally, 256 signal sources Q are connected with inputs E001 to E256 and 256 signal drains S are connected with outputs A001 to A256.

Figure 2:
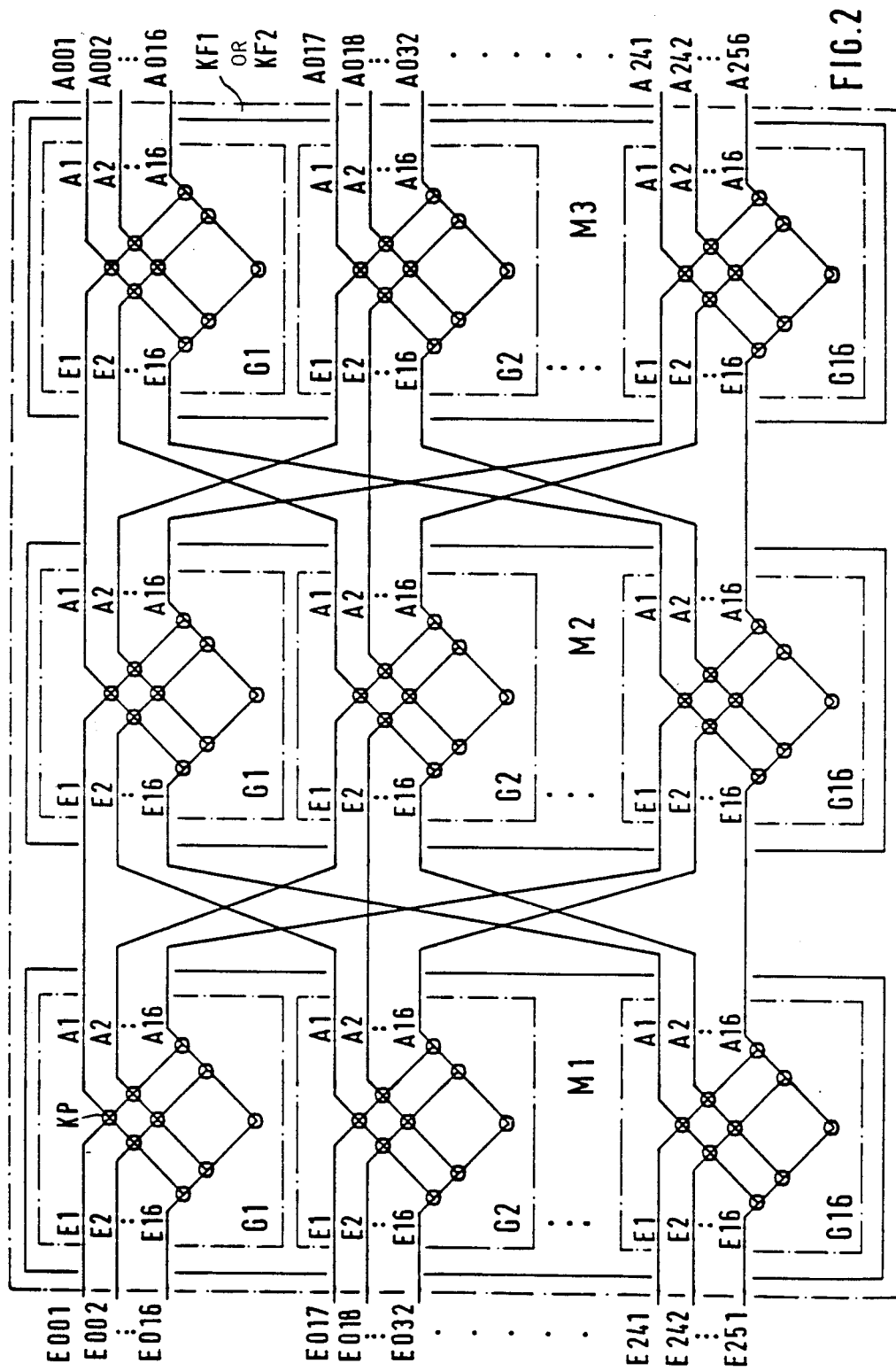
FIG. 2 is a block circuit diagram of one of the identical coupling fields KF1 or KF2.

FIG. 2 shows a block circuit diagram for the first and second coupling fields KF1 and KF2, respectively. Again shown are the first stage M1, the second stage M2 and the third stage M3 and the coupling matrixes G1 to G16 of which each stage is formed. Each coupling matrix is composed of 256 switching points KP which are arranged in a 16×16 matrix. The inputs E1 to E16 and the outputs A1 to A16 of each coupling matrix are also shown.

The inputs E1 to E16 of each of the 16 coupling matrixes G1 to G16 of the first stage M1 form the 256 inputs E001 to E256 of coupling fields KF1 and KF2, respectively. Similarly, the outputs A1 to A16 of each of the 16 coupling matrixes G1 to G16 of the third stage M3 form the 256 outputs A001 to A256 of coupling fields KF1 and KF2, respectively.

The outputs A1 to A16 of each coupling matrix G1 to G16 of the first stage M1 and of the second stage M2 are connected, via systematically guided intermediate lines, with the inputs E1 to E16 of coupling matrixes G1 to G16 of the second stage M2 and the third stage M3, respectively. The system for these intermediate lines is as follows:

The ordinal of an output or input, respectively, is equal to the ordinal of the coupling matrix with which this input or output is connected.

In the embodiment described here, this means that the connections are as shown in FIG. 2, namely:

(a) all first outputs, i.e. A1, of the coupling matrixes G1 to G16 in the first stage M1 are connected with the first coupling matrix G1 of the second stage M2; all second outputs A2 of the coupling matrixes G1 to G16 in the first stage M1 are connected with the second coupling matrix G2 of the second stage M2, etc.;

(b) all first inputs E1 of the coupling matrixes G1 to G16 of the second stage M2 are connected with the first coupling matrix G1 of the first stage M1; all second inputs E2 of the coupling matrixes G1 to G16 of the second stage M2 are connected with the second coupling matrix G2 of the first stage M1, etc..

The connections stated under (a) and (b) above apply in a similar manner to the intermediate connections between the second and third stages, M2 and M3, respectively.

Figure 3:
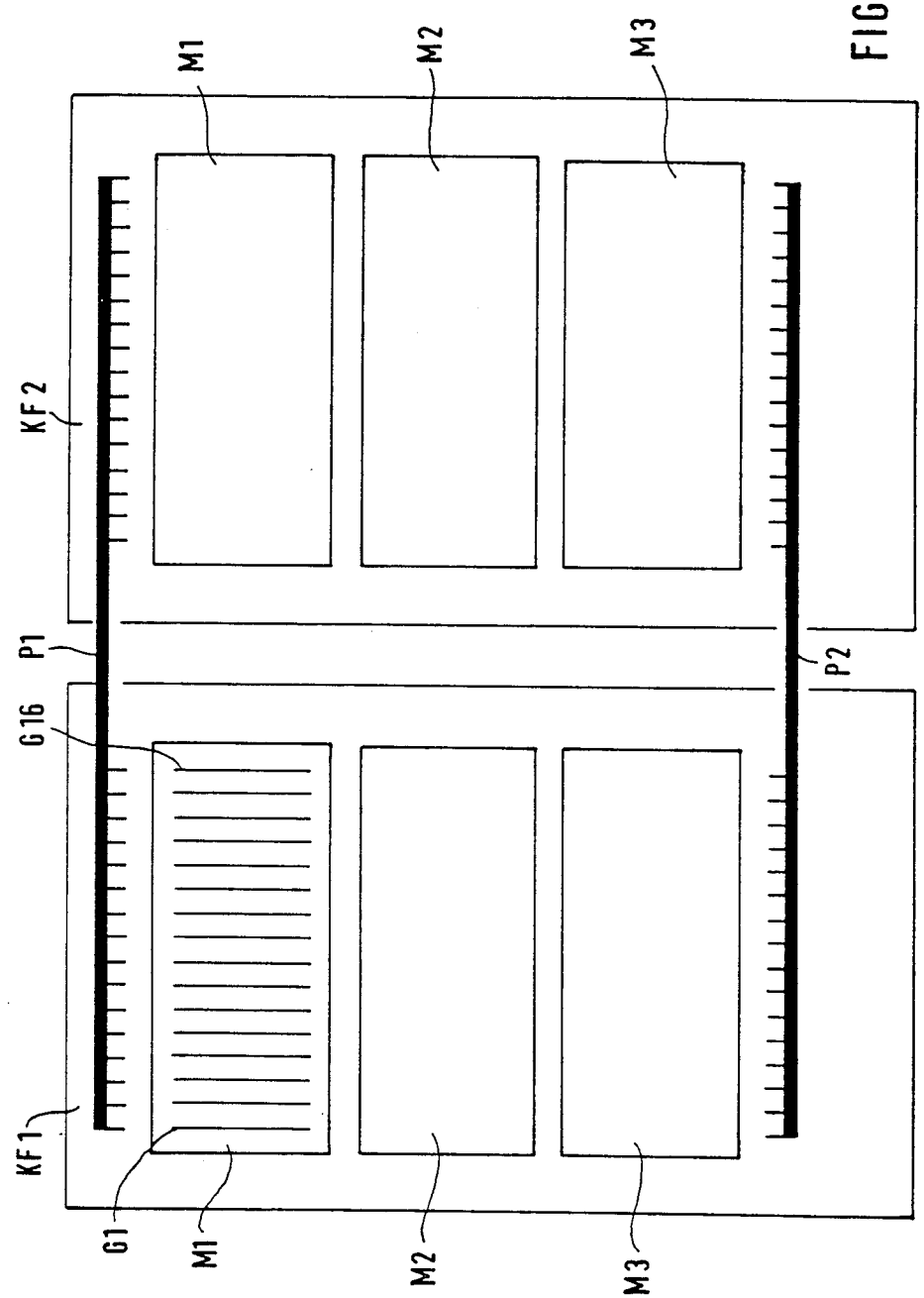
FIG. 3 is a schematic showing the mechanical structure of two switchboards each containing a respective one of the coupling fields KF1 and KF2.

FIG. 3 shows the mechanical structure of two switchboards, one for each coupling field. To make this association clearer, the switchboards are identified with the respective identifications of the coupling fields, i.e. KF1 and KF2, respectively. Each switchboard has a first magazine M1, a second magazine M2 and a third magazine M3. Each magazine includes the 16 coupling matrixes G1 to G16 of a stage. The identical reference numerals M1, M2 and M3 for the magazines and for the stages in FIGS. 1 and 2 indicate their respective associations.

Each coupling matrix is configured as a connector module. Since, according to FIGS. 1 or 2, each stage has 16 coupling matrixes, each magazine also contains 16 connector modules. These 16 connector modules are shown in the first magazine M1 of the first switchboard KF1. The first module is identified as G1 and the last module as G16. By selecting the same reference numerals G1 to G16, the association with the coupling matrixes shown in FIGS. 1 and 2 is again clear. P1 and P2 identify first and second parallel wire connections between coupling fields KF1 and KF2.

Figure 4:
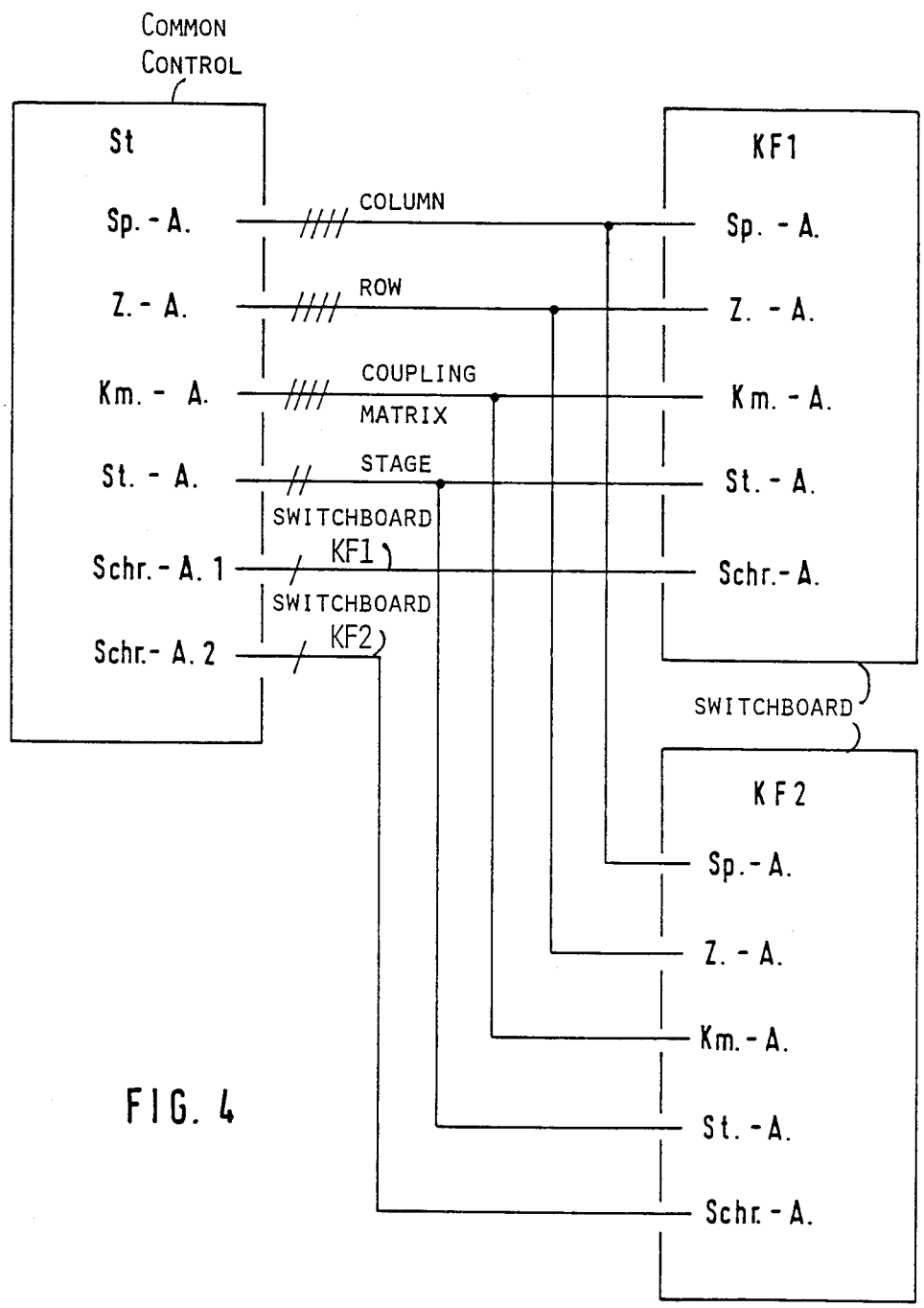
FIG. 4 is a block circuit diagram showing a common control for the two coupling fields KF1 and KF2.

The control of the two coupling fields KF1 and KF2 by means of a common control St will be described with reference to FIG. 4. This control includes four output lines for carrying the address corresponding to respective switching points to be switched through, i.e. for the column address Sp.-A., the row address Z.-A. and for the coupling matrix address Km.-A. Two output lines are provided for carrying the stage address St.-A. These outputs are each connected by means of four or two wires, respectively, with the identically named inputs of coupling fields KF1 and KF2. Since, corresponding to its 16 inputs and 16 outputs, each coupling matrix has 16 columns and 16 rows, each stage has 16 coupling matrixes and each coupling field has three stages, it is sufficient to have four wires for each one of the column, row and coupling matrix addresses and two wires for the stage address in order to unequivocally identify each switching point to be switched through if binary coding is employed. The respective switchboard or coupling field KF1 or KF2 is identified by individually guided wires which connect the two outputs Schr.-A.1 and Schr.-A.2 for the switchboard addresses with the respective inputs Schr.-A. in switchboards KF1 and KF2.

Each one of coupling fields KF1 and KF2 individually already permits the connection of each input with any desired output. However, blocking may occur; that is if a plurality of connections have already been established, a further connection from a certain input to a certain output can no longer be switched through. The parallel connection of two such coupling fields according to the invention avoids such blocking so that the coupling arrangement according to the invention is non-blocking.

According to a further aspect of the invention, error free production of the intermediate lines is permitted without significant manual labor. This modification will be described with reference to FIGS. 5 to 9.

Referring first to FIG. 5, there is again shown the three magazines M1 to M3 in their mechanical arrangement one above the other. The first magazine M1 is at the top, below it the second magazine M2 and at the bottom the third magazine M3. They are mechanically connected with one another in a manner not shown. The second magazine M2 is thus adjacent to the first magazine M1 as well as to the third magazine M3.

Each magazine has 16 guide strips F at its top and 16 guide strips F at its bottom into which are brought the 16 connector modules on which the coupling matrixes G1 to G16 are supported, respectively. Only the bottom guide strips F are shown. Of the 48 connector modules (16 per magazine), only the sixteenth connector module G16 of the third magazine M3 is shown. Each connector module is equipped with a multipoint connector having a first pin strip S1 and a second pin strip S2. Instead of the two pin strips S1 and S2, a single, large pin strip may also be provided.

Moreover, a first rear wall circuit board L1 and a second rear wall circuit board L2 are shown. Each such rear wall circuit board is equipped with two rows of 16 socket strips as receptacles, with socket strips B1 to B16 constituting the upper row and socket strips B17 to B32 constituting the bottom row. Socket strip B17 and a few other, unidentified socket strips are not visible here. Also provided are a third rear wall circuit board L3 and a fourth rear wall circuit board L4. These are each equipped with only one row of 16 socket strips B33 to B48 and B49 to B64, respectively.

Dashed lines indicate into which one of the guide strips the illustrated connector module G16 is brought when it is plugged in, which position the rear wall circuit boards take up at the rear of the magazines after assembly, and that connector strips S1 and S2 of the illustrated connector module G16 engage in socket strip B32 of the second rear wall circuit board L2 and in socket strip B64 of the fourth rear wall circuit board L4. In the same manner, the connector strips of the connector modules that are not shown engage in their associated socket strips. Thus, an association results as shown in the table below:

| Connector Modules G1 to G16 in magazine | Connector strip | Rear Wall circuit board | Socket strips | |
|---|---|---|---|---|
| M1 | S1 | L3 | B33 | to B48 |
|    | S2 | L1 | B 1 | to B16 |
| M2 | S1 |    | B17 | to B32 |
|    | S2 | L2 | B 1 | to B16 |
| M3 | S1 |    | B17 | to B32 |
|    | S2 | L4 | B49 | to B64 |

If, instead of the two connector strips S1 and S2, a single, large connector strip is provided, the respective part of this strip engages in the corresponding part of the socket strip according to the table above.

Thus, rear wall circuit board L1 includes the region of connector strips S2 of the first magazine M1 and the region of connector strips S1 of the second magazine M2. The region of connector strips S2 of the first magazine M1 is adjacent the region of the connector strips S1 of the second magazine M2. The same applies appropriately for rear wall circuit board L2.

Figure 5:
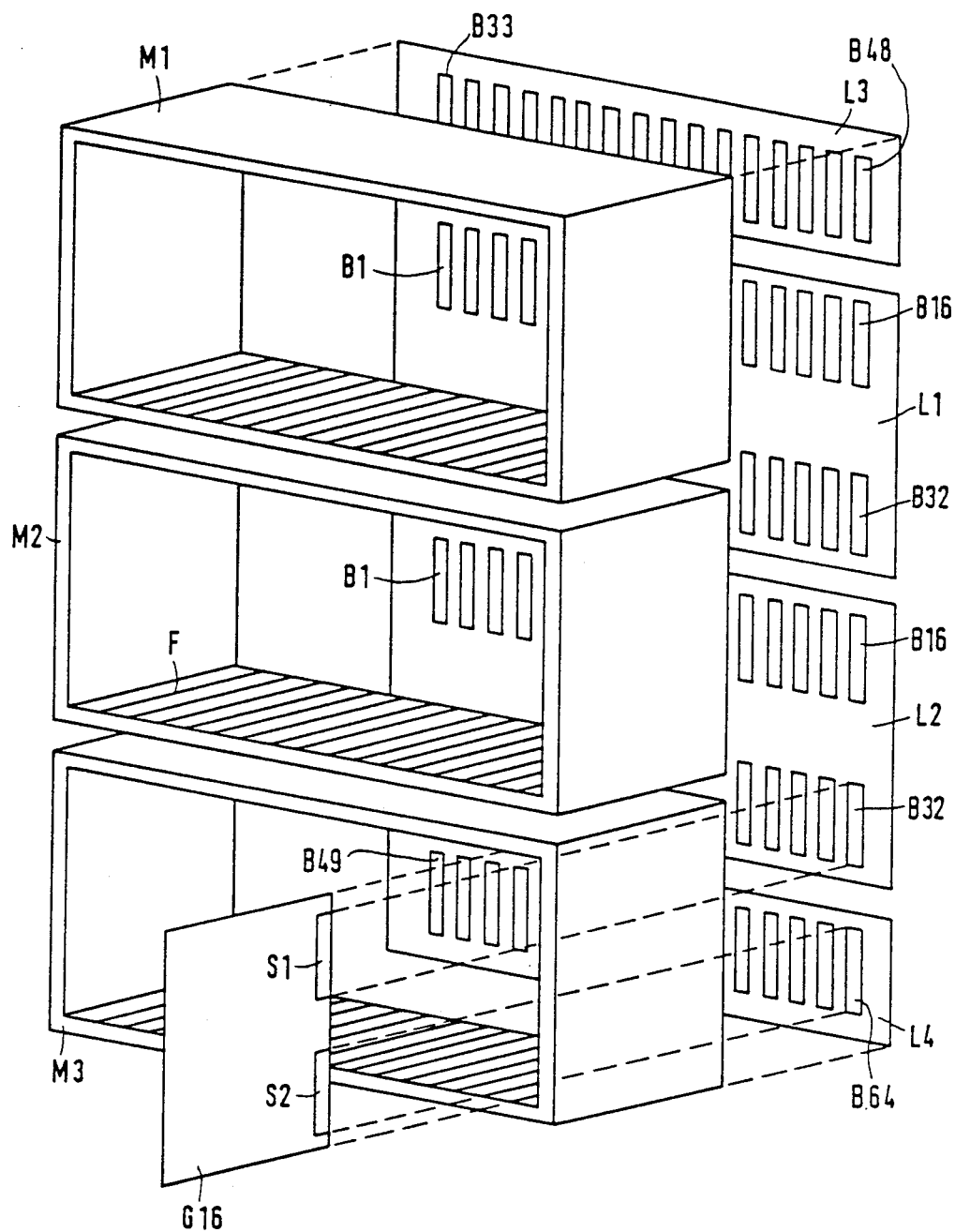
FIG. 5 a schematic illustration of the mechanical arrangement of three magazines M1 to M3 on top of one another.
Figure 6:
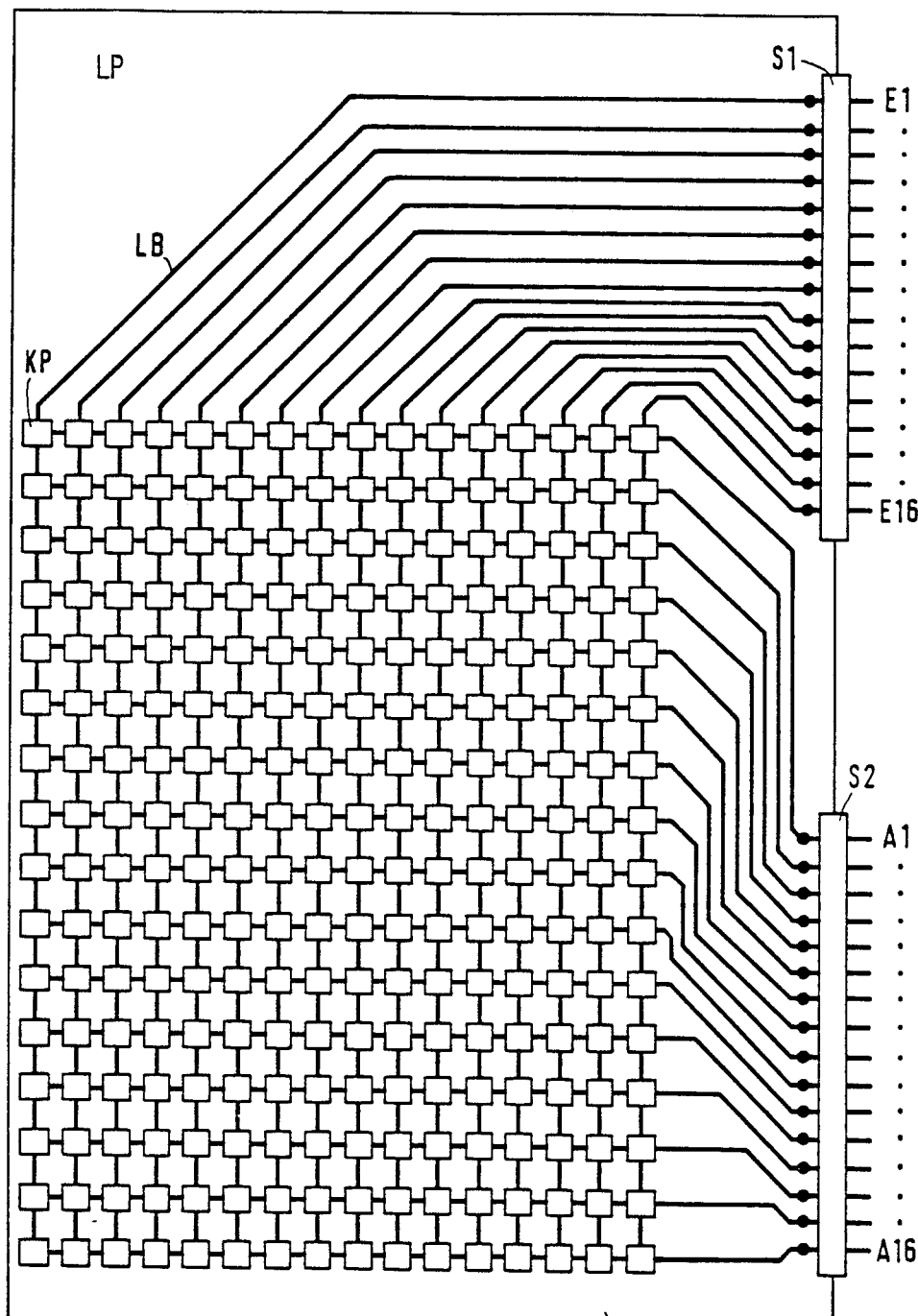
FIG. 6 is a schematic of a connector module circuit board provided with a matrix of switching points.

FIG. 6 shows one of the connector modules G1 to G16. It is composed of a circuit board LP which is provided with the 256 switching points KP arranged in a 16×16 matrix, a first connector strip S1 and a second connector strip S2. Circuit board LP is provided with conductor paths LB which interconnect switching points KP and connect them with the sixteen inputs E1 to E16 and the sixteen outputs A1 to A16 on connector strips S1 and S2, respectively. Inputs E1 to E16 are all brought to the first connector strip S1; outputs A1 to A16 are all brought to the second connector strip S2. As can be seen in FIG. 5, in the connector modules of the second magazine M2, the first connector strip S1 lies closest to the first magazine M1. Therefore, inputs E1 to E16 are brought to this strip since they must be connected, according to FIG. 2, with the outputs of the connector modules of the first magazine M1. The same applies correspondingly for the second connector strips S2 and for the connector modules of the other magazines.

Conductor paths LB are here shown as having but one pole. However, since coupling fields are usually constructed with two or even four conductors, one must imagine that two or four conductor paths, respectively, are represented by one line and the corresponding number of plug-in pins are provided on the connector strips.

Figure 7:
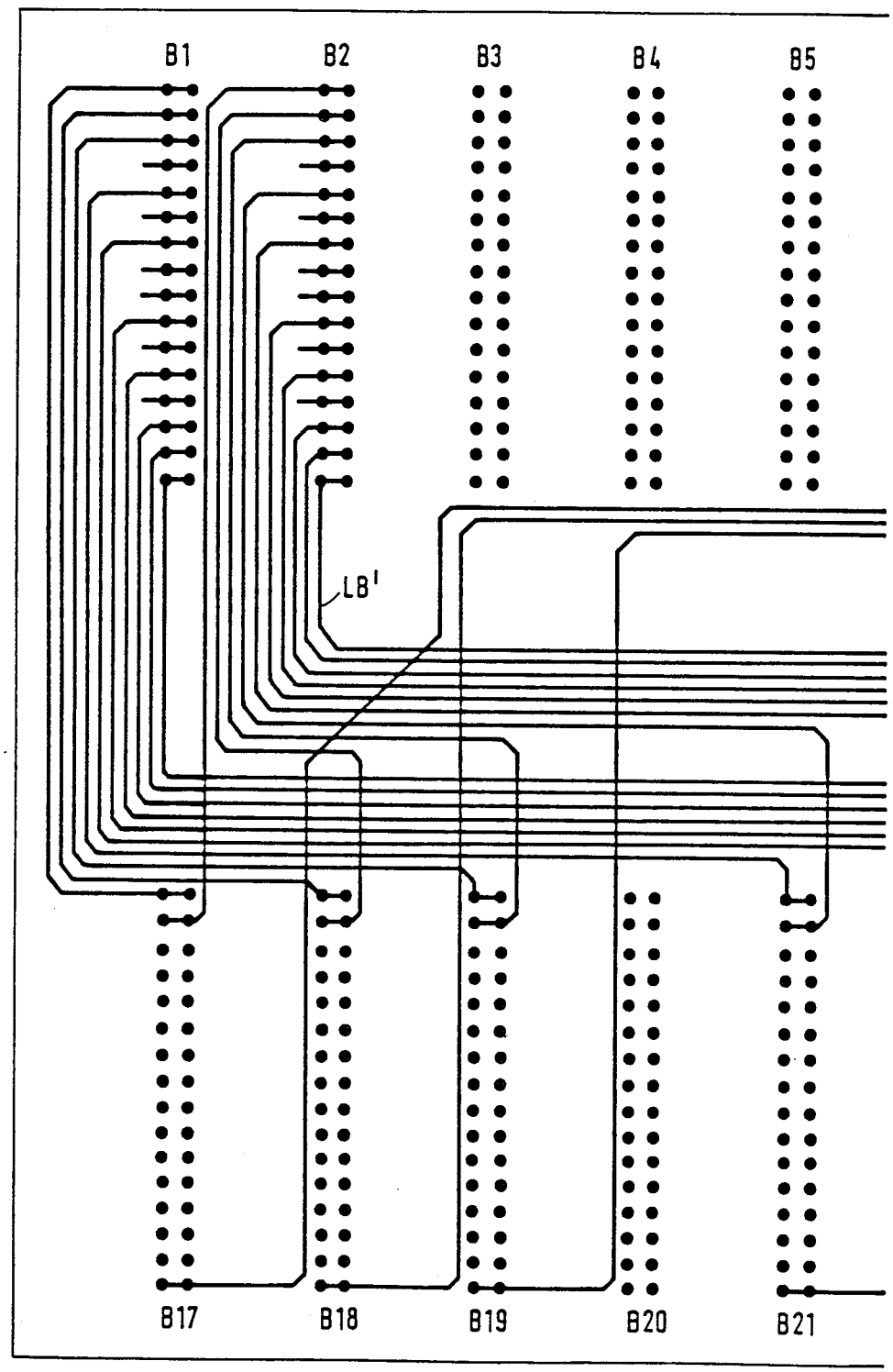
FIGS. 7 to 9 comprise a schematic of a rear wall circuit that can be utilized to connect the connector module circuit boards of adjacent magazines of a coupling field.
Figure 8:
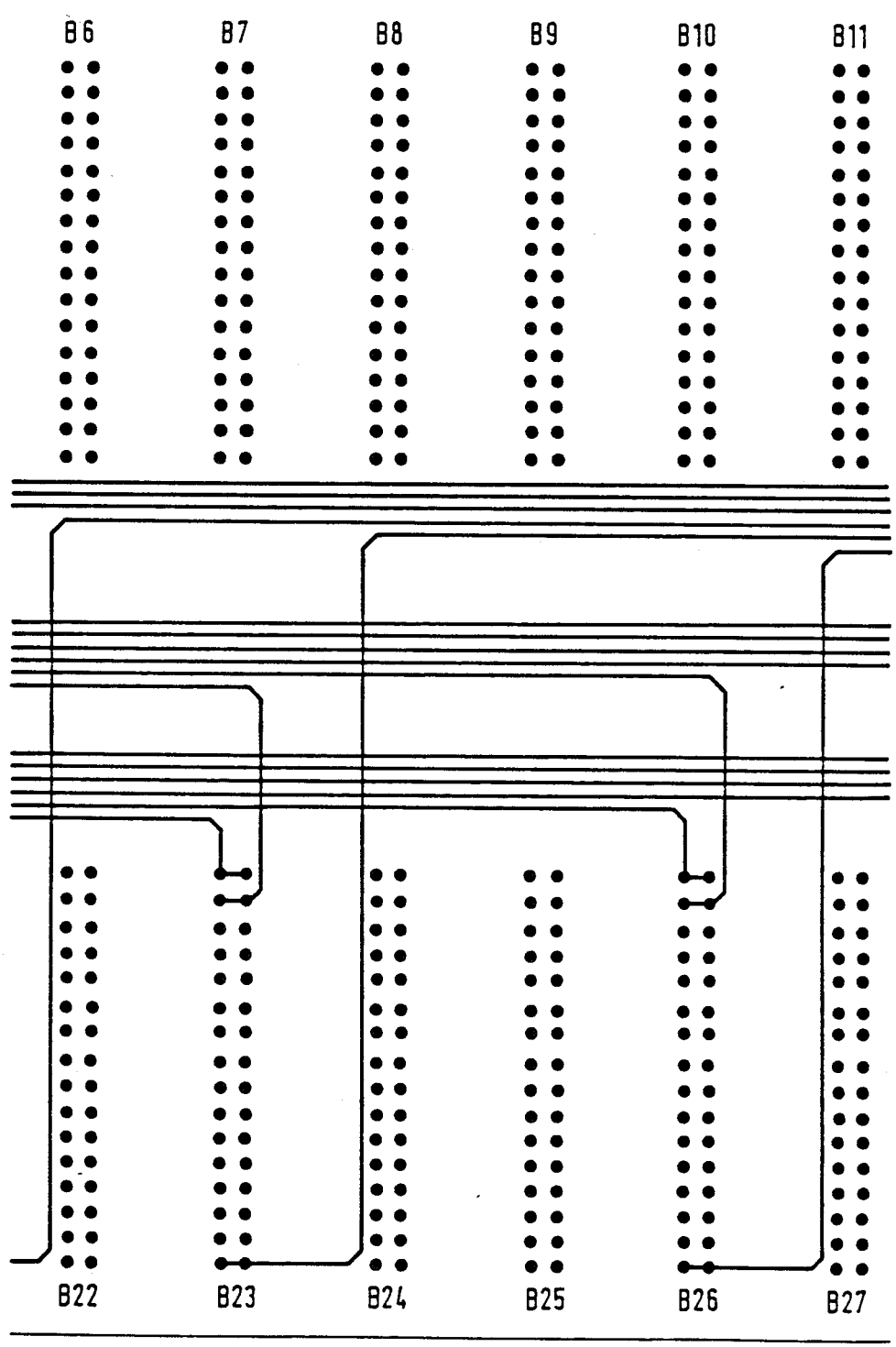
Figure 9:
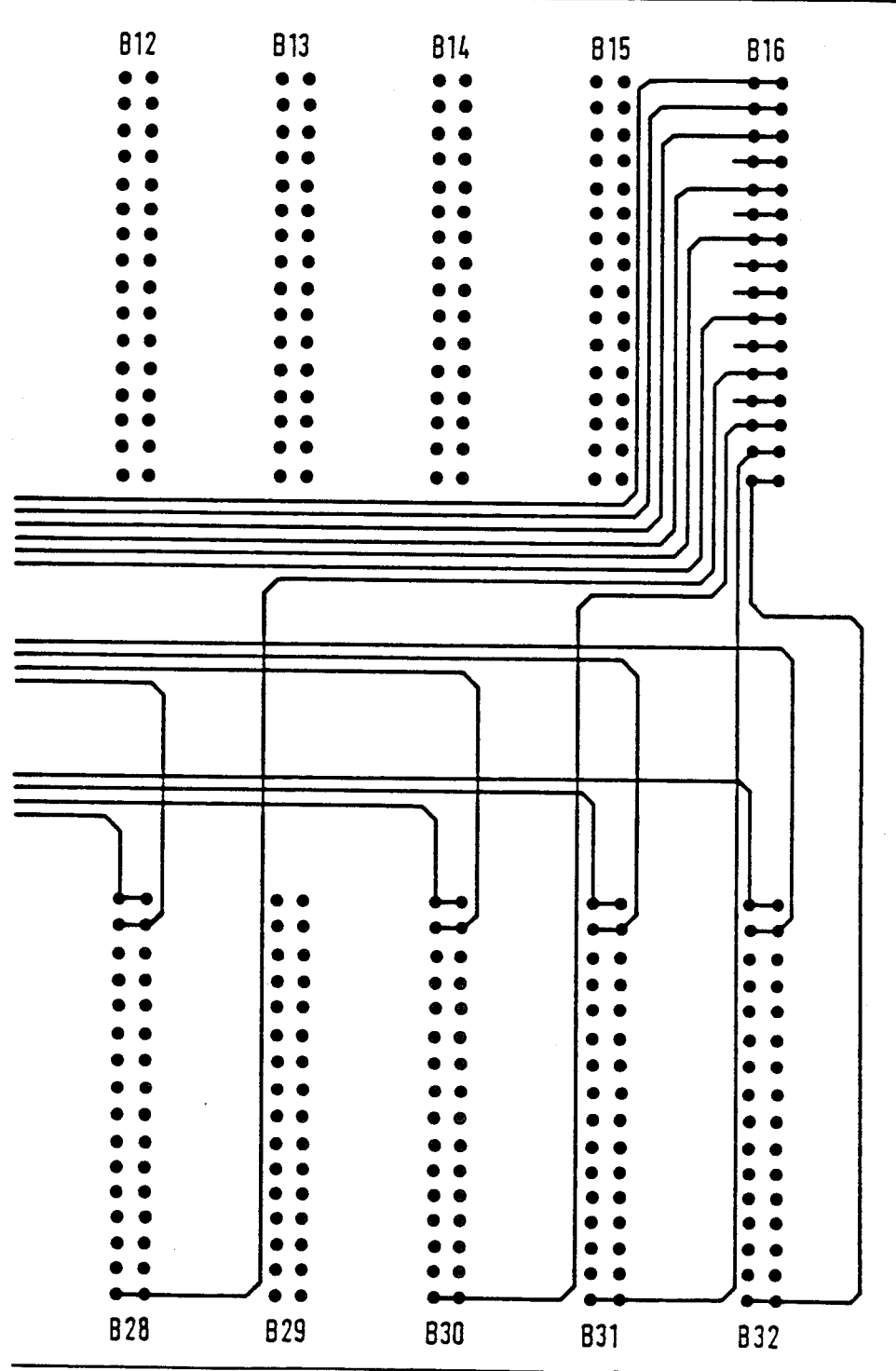

FIGS. 7, 8 and 9 show one of the rear wall circuit boards L1 and L2. These figures should be placed next to one another, FIG. 7 on the left and FIG. 9 on the right. The upper and lower lines, respectively, as well as the left line in FIG. 7 and the right line in FIG. 9 represent the outlines of this rear wall circuit board. The locations for socket strips B1 to B32 are marked B1 to B16 (upper row) and B17 to B32 (lower row). The socket strips themselves are not shown; the dots merely indicate the soldering spots for their soldered pins. If one looks at the first rear wall circuit board L1, FIGS. 5 and 6 indicate that outputs A1 to A16 of connector modules G1 to G16 of the first magazine M1 are placed on socket strips B1 to B16. Inputs E1 to E16 of the connector modules of the second magazine M2 are placed on socket strips B17 to B32, beginning each time at the top with E1 and A1, respectively.

The intermediate lines which must be provided according to FIG. 2, are formed by conductor paths LB'.

A single-pole illustration has again been selected here; and again, instead of one line, one must imagine two conductor paths since, as indicated by the illustration of two soldering spots for each input and output, the rear wall circuit board shown here is intended for a two-wire coupling field. Of the many intermediate lines, only a few are shown here. It is also not shown that the conductor paths are distributed to different planes of a multilayer plate so as to accommodate their large number and to be able to cross them over.

The second rear wall circuit board is designed like the first since, according to FIG. 2, the system of guiding the intermediate lines between the first stage and the second stage is the same as between the second stage and the third stage.

The 256 inputs E001 to E256 of the respective coupling fields KF1 and KF2 are brought to socket strips B33 to B48 of the third rear wall circuit board L3 and the outputs A001 to A256 of the respective coupling fields KF1 and KF2 are brought to the socket strips B49 to B64 of the fourth rear wall circuit board L4 (see FIG. 5). The soldering pins of these socket strips are connected to the parallel wires P1 and P2 as well as to the leads to signal sources Q and signal drains S.

Not shown are switching means and control lines for switching through and switching off the switching points KP. This also applies for the multi-point connector modules.

Figure 10:
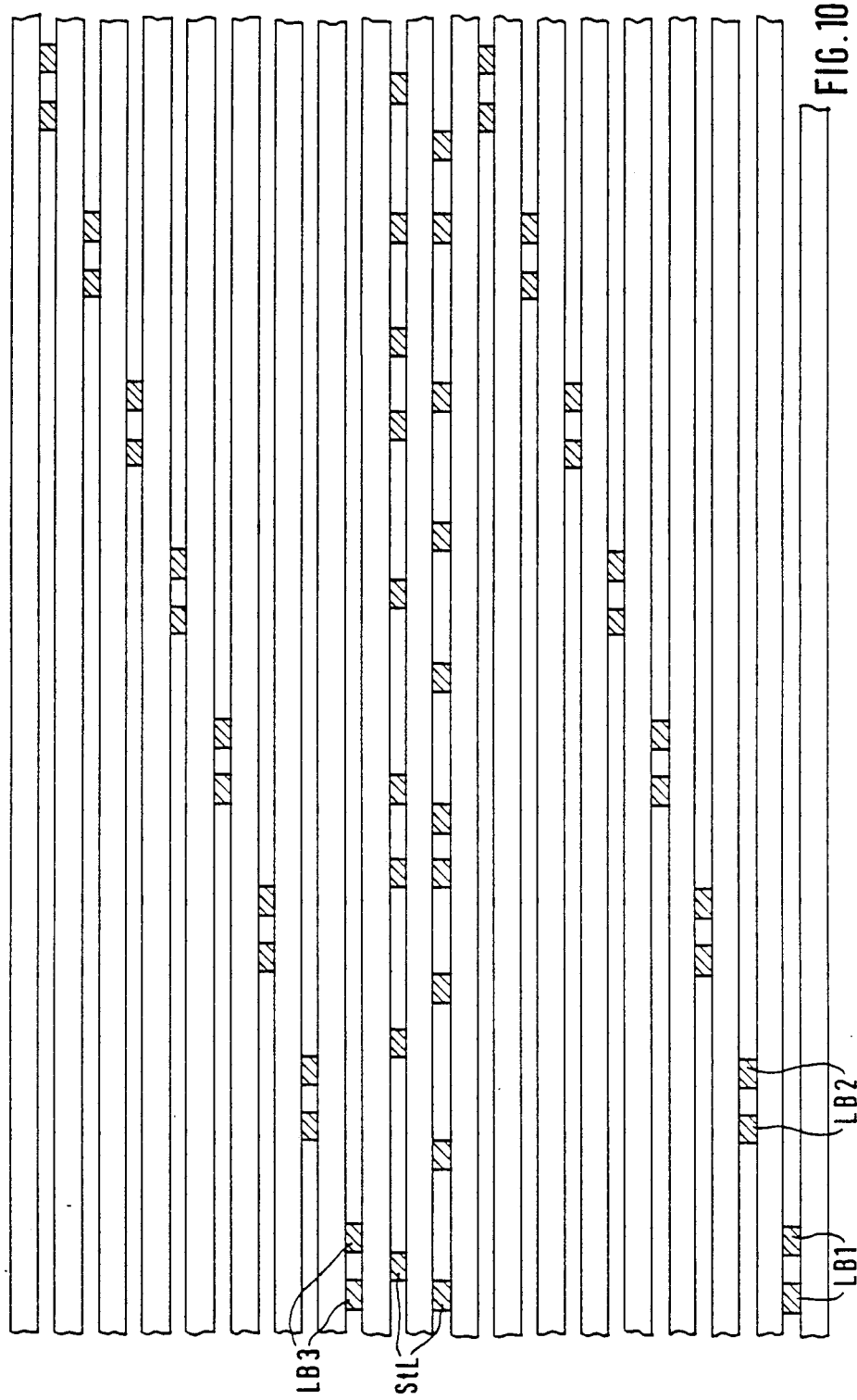
FIG. 10 is a schematic sectional view of a rear wall circuit board showing the offset positioning of conductors or conductor pairs according to another aspect of the invention.

According to yet a further aspect of the invention, sufficient crosstalk attenuation can be maintained between conductor paths of the rear wall circuit boards for the transmission of digital signals at a bit rate up to 150 Mbit/s. Such high crosstalk attenuation is achieved with the use of a multilayer circuit board as shown in FIG. 10. FIG. 10 is a sectional view of a rear wall circuit board, such as L1 or L2, showing the position of the conductor paths within it. The circuit board has 19 layers between which lie the conductor paths which are shown by hatching. It is assumed that the coupling field is constructed of two wires, i.e. each connection is established in the form of a pair of conductor paths. The first pair is marked LB1 and lies in the first plane between the first and second layers. To realize a sufficiently high crosstalk attenuation, the second pair LB2 is disposed in the next plane, i.e. the second plane, not directly next to the first pair LB 1, but offset to the side to meet the requirement for crosstalk attenuation. This lateral offset extends over eight planes. The ninth and tenth planes accommodate conductor paths StL for the control lines not shown in FIGS. 7 to 9. The existing crosstalk attenuation requirements do not permit the placement of a pair LB3 without offset with respect to the first pair LB1 before the eleventh plane.

According to one implementation, the layers are made of a material of the type GFN according to MIL P-13949F. The thickness of a layer is 0.15 mm. The thickness of a conductor path is 0.017 mm. The width of a conductor path is 0.2 mm. The width of the gap between the conductor paths of a pair is 0.2 mm. The size of the offset between conductor paths of adjacent planes is 1.2 mm, measured between the middles of the concerning pairs. The crosstalk attenuation achieved by the described provisions is not less than 43 dB between the pairs of adjacent planes and not less than 47 dB between those pairs of planes without offset, as for example between the pairs of the first and eleventh plane or of the second and twelfth plane and so on. The above described embodiment of a multilayer board is suitable to transmit NRZ-signals with a bit rate up to 300 Mbit/s.

The conductor paths of the rear wall circuit boards can have no abutting faces. To avoid such abutting faces, bends in the conductor paths at an acute angle are avoided entirely, as shown in FIGS. 7 to 9, and bends at a right angle are resolved to two obtuse angle bends. Instead of changing the bends to obtuse angles it is also possible to provide a rounded version. This also applies for the conductor paths of the multi-point connector modules. If acute angle bends cannot be avoided, they are also resolved to a plurality of obtuse angle bends or are rounded off.

Figure 11:
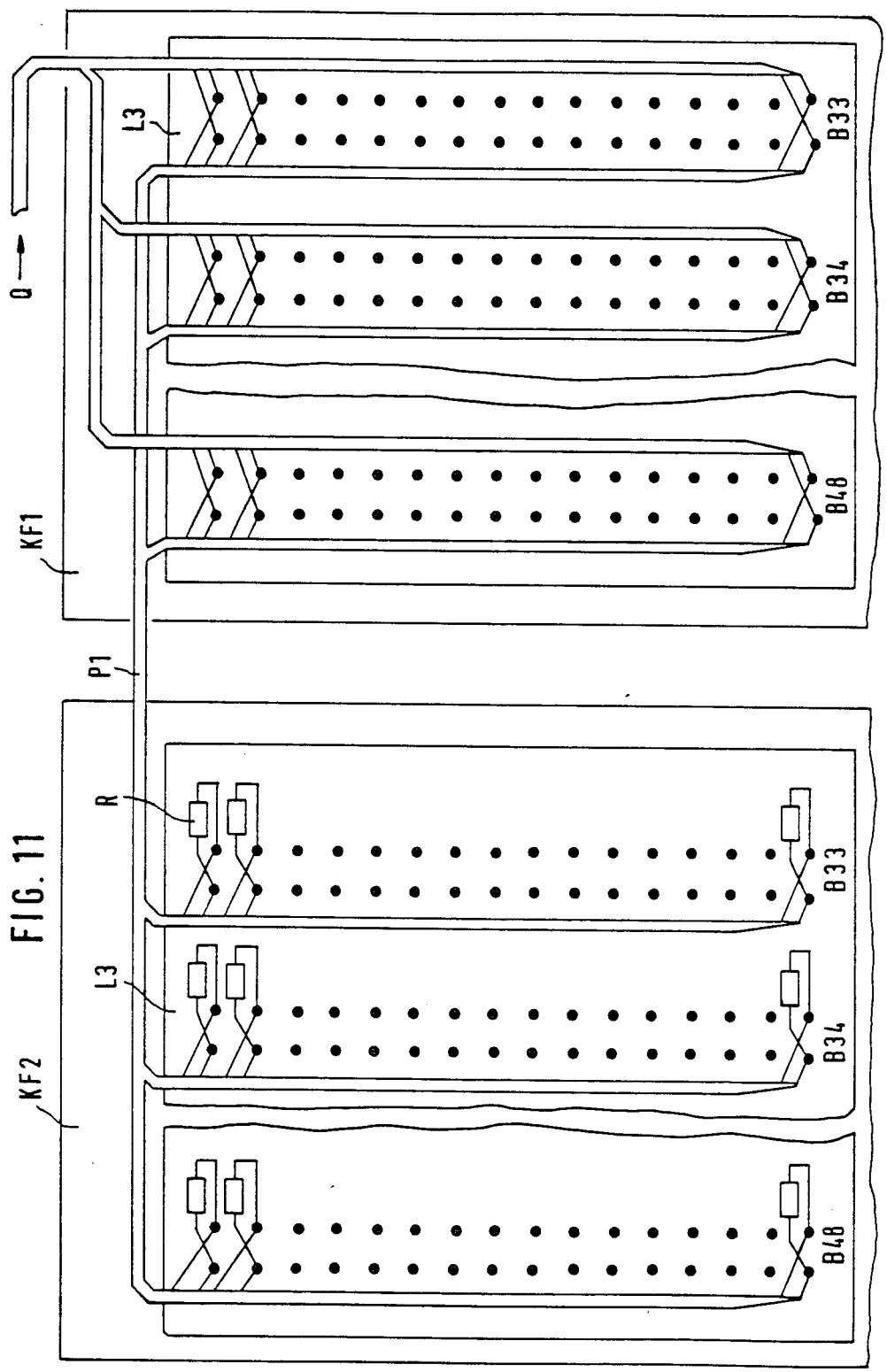
FIG. 11 is a schematic showing two switchboards KF1 and KF2 and respective rear wall circuit boards L3 disposed therein.

Signal sources Q are connected with inputs E001 to E256 without reflection. This is accomplished as shown in FIG. 11 which illustrates the two switchboards or coupling fields KF1 and KF2 and the rear wall circuit boards L3 disposed therein. The dots represent soldering pins for socket strips B33 to B48. An unidentified cable leads from signal sources Q to socket strips B33 to B48 in the first switchboard KF1 and the wires of this cable are soldered to the soldering pins of these socket strips. Only a few of these wires are shown. These soldering pins are further soldered to the wires of the parallel cable P1. The other ends of the wires of cable P1 are connected to the soldering pins of socket strips B33 to B48 of the second switchboard KF2. These soldering pins are also connected to resistors R. Their resistance value is equal to the characteristic impedance of the parallel wires P1 and of the cable coming from signal sources Q. These resistors produce the necessary reflection-free termination since the coupling matrixes themselves, due to their high input resistances, are unable to provide such a termination. Instead of soldering, any other connection technique can also be employed. Resistors R and the cable coming from the signal sources may also be exchanged, i.e. the cable terminates in second switchboard KF2 and resistors R are disposed in first switchboard KF1.

Figure 12:
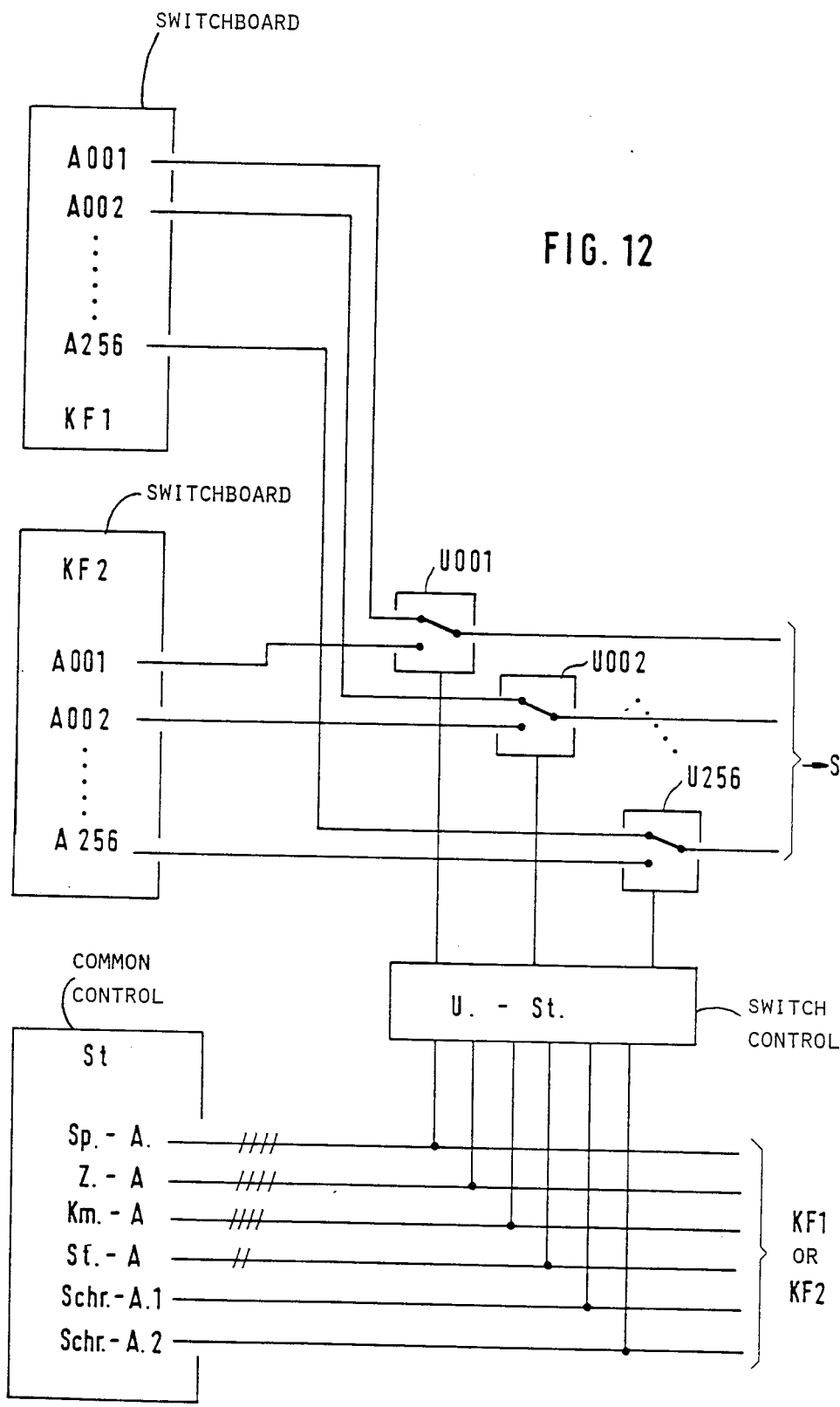
FIG. 12 a block circuit diagram of a control circuit for two switchboards KF1 and KF2.

The corresponding configuration of the "parallel cable" at the output will be described with reference to FIG. 12, which shows the two switchboards KF1 and KF2, each with their 256 outputs A001 to A256, as well as 256 electronic switches U001 to U256. Each one of the outputs A001 to A256 is connected with the associated first or second input, respectively, of the associated electronic switch U001 to U256. The outputs of the electronic switches are connected with signal drains S. Moreover, the electronic switches are provided with control inputs which are connected with a switch control U.-St. Switch control U.-St. is able to control the electronic switches U001–U256 into their first or second switch position. The first switch position is shown here in which the respective output of the first coupling field KF1 is switched through to the respective signal drain S.

Since the coupling matrixes G1 to G16 have terminating resistances at their outputs, a simple parallel connection as at their inputs is not possible. Rather, only one of the respective outputs of coupling fields KF1 and KF2, respectively, must be switched through to the respective signal drain S. This is accomplished by electronic switches U001 to U256 in dependence on whether the respective connection was switched through via the first coupling field KF1 or the second coupling field KF2. The setting information required for this procedure is obtained by the switch control U.-St. from column address Sp.-A., row address Z.-A., coupling matrix address Km.-A., stage address St.-A. and switchboard addresses Schr.-A.1 and Schr.-A.2. For that reason, the switch control U.-St. is connected with the outputs of common control St which have already been mentioned in connection with the description of FIG. 4.

Figure 13:
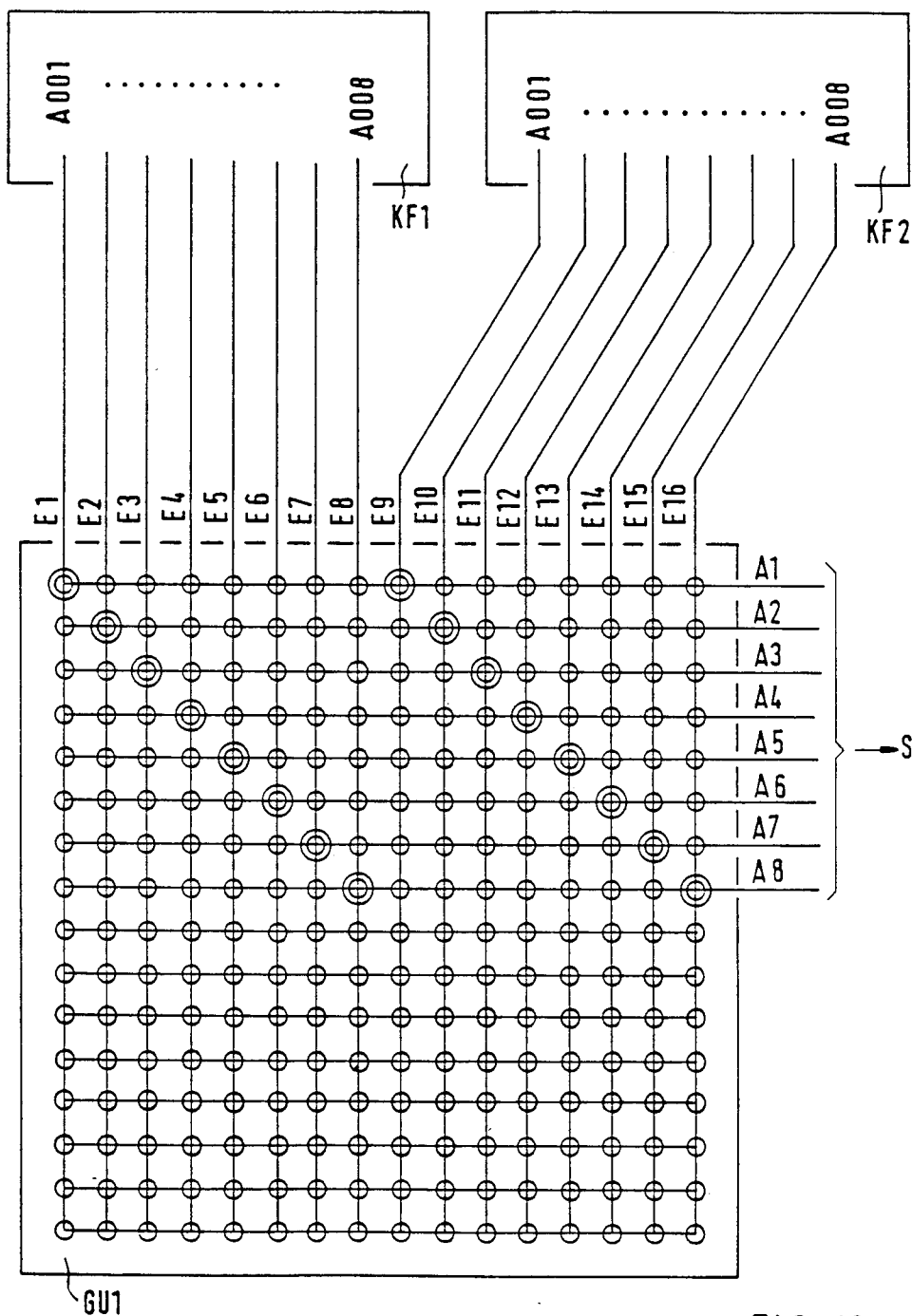
FIG. 13 is a schematic of an embodiment of a switching matrix employed according to another aspect of the invention.

An advantageous embodiment of the electronic switches will be described with reference to FIG. 13. To avoid a multitude of connector module types, the same coupling matrixes are employed as electronic switches as they were used in coupling fields KF1 and KF2 and described in connection with FIG. 6. Such a coupling matrix is also shown in FIG. 13 and there identified as GU1. Circles indicate the 256 switching points. Inputs E1 to E8 are connected with outputs A001 to A008 of the first coupling field KF1. Inputs E9 to E16 are connected with outputs A001 to A008 of the second coupling field KF2. Outputs A1 to A8 of this coupling matrix are connected with the associated eight signal drains S.

The arrangement operates as follows: If, for example, a connection is to be switched through to the signal drain connected at output A1 of coupling matrix GU1, either the switching point connecting input E1 or input E9 with output A1 in this coupling matrix is switched through, depending on whether the connection is established via the first coupling field KF1 o the second coupling field KF2. In a similar manner, connections are established with the other outputs. The switching points required in each case are emphasized in FIG. 13 by double circles.

The further outputs A009 to A256 of coupling fields KF1 and KF2 are connected together in the same manner. Thus, there result 32 such coupling matrixes, their accommodation being shown in FIG. 14, wherein the two switchboards KF1 and KF2 contain, in addition to magazines M1 to M3, fourth magazines M4 for accommodating the 32 coupling matrixes GU1 to GU32. Coupling matrixes GU1 to GU16 are disposed in the first switchboard KF1, and coupling matrixes GU17 to GU32 are disposed in the second switchboard KF2.

Figure 15:
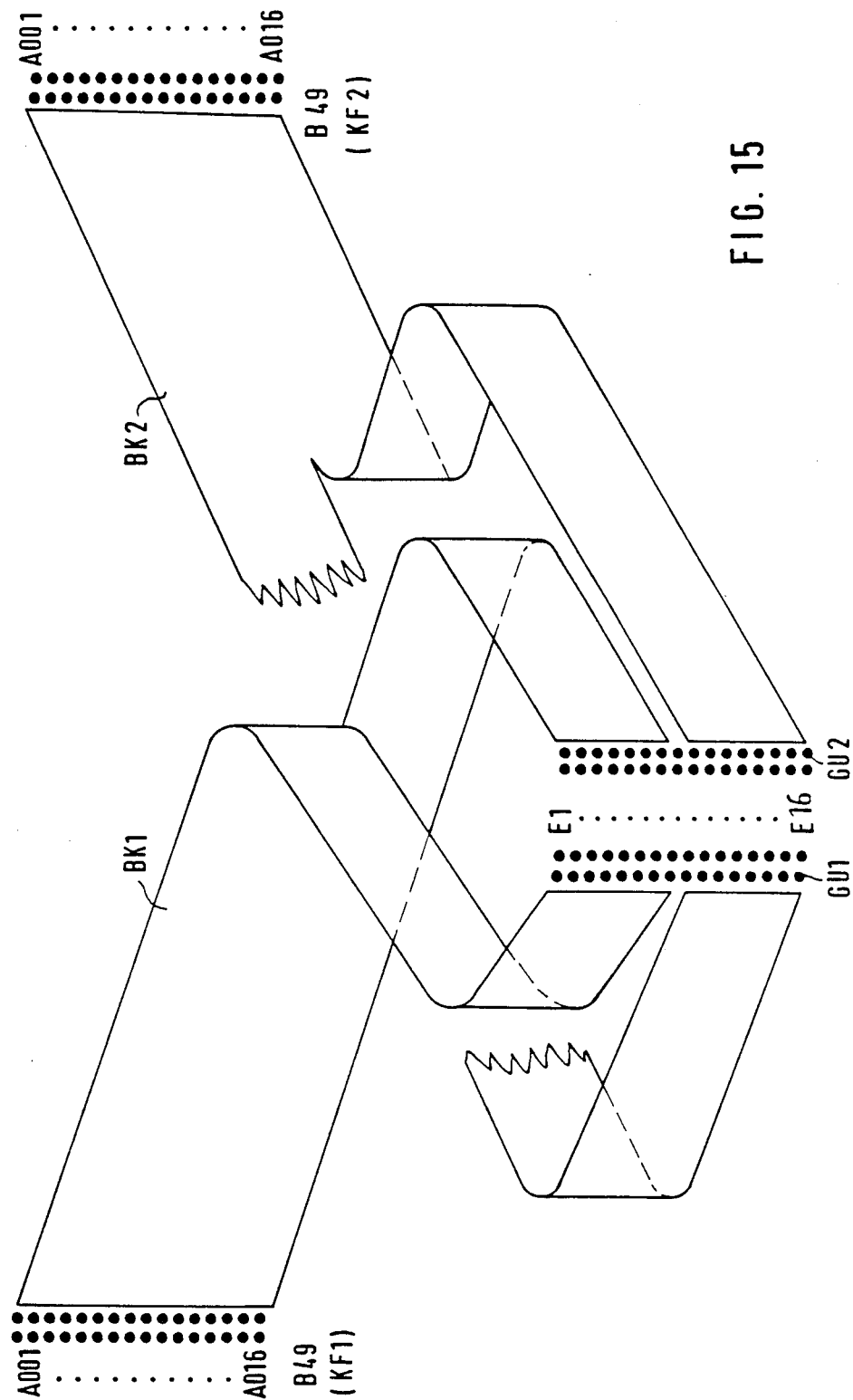
FIG. 15 is a schematic showing two flat cables arranged for connecting the outputs of two switchboards to the inputs of coupling matrixes.

FIG. 15 shows an advantageous wiring between outputs A001 to A256 of coupling fields KF1 and KF2, respectively, and the inputs E1 to E8 of coupling matrixes GU1 to GU32. The soldering pins of socket strips B49 of the first coupling field KF1 and of the second coupling field KF2 are shown by 32 dots, respectively, to which are connected outputs A001 to A016. Another 32 dots identify the soldering pins of the socket strips to which inputs E1 to E16 of coupling matrixes GU1 and GU2 are connected. Two flat cables BK1 and BK2 are provided, each having 16 juxtaposed pairs of conductors. Outputs A001 to A016 of the first coupling field KF1 are connected with the inputs E1 to E8 of coupling matrixes GU1 and GU2 by way of the first flat cable. Outputs A001 to A016 of the second coupling field KF2 are connected with inputs E9 to E16 of coupling matrixes GU1 and GU2 by way of the second flat cable. The flat cables are slit in the middle for a length sufficient to permit connection to the socket strips of coupling matrixes GU1 and GU2.

In the same manner, the further outputs of coupling fields KF1 and KF2 are connected with the associated coupling matrixes GU3 to GU32 by means of further pairs of flat cables.

The use of flat cables is made possible by the association, described in connection with FIG. 13, of eight outputs of coupling fields KF1 and KF2 with each one of inputs A1 to A8 and A9 to A16, respectively, of one of coupling matrixes GU1 to GU32. The use of flat cables makes it possible for these connections to have electrical characteristics which fluctuate very little from one connection to the other, thus making them suitable for the transmission of digital signals at a high bit rate.

The present disclosure relates to the subject matter disclosed in European Patent Application No. 86 104 544.1 of Apr. 3rd, 1986, the entire specification of which is incorporated herein by reference.

It will be understood that the above description of the present invention is susceptible to various modifications, changes and adaptations, and the same are intended to be comprehended within the meaning and range of equivalents of the appended claims.

What is claimed is:

1. In a three-stage coupling arrangement for an electrical data exchange system including a first stage, a second stage and a third stage, each stage comprising: a plurality of coupling matrixes each having inputs and outputs and a matrix of switching points for selectively coupling the inputs with the outputs of the coupling matrix; and intermediate conductors for connecting the outputs of the coupling matrixes of one stage with the inputs of the coupling matrixes of a next stage, the inputs of the coupling matrixes of the first stage constituting the inputs of the coupling arrangement and the outputs of the coupling matrixes of the third stage constituting the outputs of the coupling arrangement, the improvement comprising:

first and second identical three-stage switchboards between which said coupling matrixes are distributed, each said stage of each said switchboard having the same number of coupling matrixes, each said coupling matrix having a number of inputs equal to its number of outputs, each one of the inputs of the coupling matrixes of the first stage of each respective switchboard constituting one of the inputs of that switchboard, each one of the outputs of the coupling matrixes of the third stage of each respective switchboard constituting one of the outputs of that switchboard, the inputs of said first switchboard being positioned in an identical numbered sequence as the inputs of said second switchboard, the outputs of said first switchboard being positioned in an identical numbered sequence as the outputs of said second switchboard, each input of said first switchboard being connected with the identically numbered input of said second switchboard, and each output of said first switchboard being connected with an identically numbered output of said second switchboard; and further including:

a common control means connected with each of said first and second switchboards for producing addresses identifying switching points to be switched through, each address including a designation of: the row and column of a switching point within a coupling matrix; the number of a coupling matrix within a stage; and the number of a stage within a switchboard; said control means further having two outputs and producing at said two outputs respective switchboard addresses identifying a respective one of said first and second switchboards;

lines connected in parallel between said common control means and the inputs of said first and second switchboards for carrying the switching point addresses to both said switchboards; and two individual lines each leading from a respective one of said two outputs of said control means to a respective one of said switchboards for carrying a corresponding switchboard address to that switchboard.

2. Coupling arrangement as defined in claim 1, wherein: each coupling matrix comprises a multi-point connector module having one edge provided with two multi-point connectors via which connections can be made to the inputs and the outputs, respectively, of said coupling matrix.

3. Coupling arrangement as defined in claim 2, wherein: each said switchboard comprises first, second and third magazines and the coupling matrixes and multi-point connector modules, respectively, of each respective stage of a switchboard are combined into respective ones of said first, second and third magazines.

4. Coupling arrangement as defined in claim 3, wherein the three magazines of each said switchboard are arranged so that the magazines of two successive stages are immediately adjacent one another.

5. Coupling arrangement as defined in claim 4, wherein the inputs and outputs of each said coupling matrix are distributed to a respective one of the two multi-point connectors so that each multi-point connector is closest to that magazine with which it is connected by way of said intermediate lines.

6. Coupling arrangement as defined in claim 5, wherein each said switchboard includes: a first rear wall circuit board via which said intermediate conductors are guided between said first and second magazines; and a second rear wall circuit board via which said intermediate conductors are guided between said second and third magazines.

7. Coupling arrangement as defined in claim 6, wherein:

each one of said first and second rear wall circuit boards is provided with a first row and a second row of socket connectors; and said rear wall circuit boards and said socket connectors are arranged so that said first row of socket connectors of a said rear wall circuit board engage the multi-point connectors of those multi-point connector modules of one magazine which carry the outputs of respective multi-point connector modules, and said second row of socket connectors engage those multi-point connectors of the multi-point connector modules of the next magazine which carry the inputs of respective multi-point connector modules.

8. Coupling arrangement as defined in claim 7, wherein: each said rearwall circuit board is constructed in multilayer technology;

said intermediate conductors or pairs of said conductors extend in parallel, in different planes of said rear wall circuit board, mutually offset to a side of one another, with the width of said offset and the number of planes over which it extends being dimensioned to maintain a required crosstalk attenuation value between the conductors or conductor pairs.

9. Coupling arrangement as defined in claim 8, wherein: said conductors have bends at an acute right angle or right angle which are either rounded off or are resolved into a plurality of obtuse angle bends.

10. Coupling arrangement as defined in claim 1, wherein:

the inputs of one said switchboard are arranged for connection with signal sources; and further including:

parallel wire connection means for connecting the inputs of said one switchboard with respective inputs of the other said switchboard; and a plurality of terminating resistances each being connected to a respective one of the inputs of said other switchboard.

11. Coupling arrangement as defined in claim 1, wherein each said switchboard includes a number of electronic switches corresponding to the number of outputs of said switchboard, each said electronic switch having a first input, a second input, an output and a control input, said first input of each said electronic switch being connected with an associated output of said first switchboard, said second input of each said electronic switch being connected with an associated output of said second switchboard, said outputs of said electronic switches being arranged for connection with respective signal drains; and switch control means for controlling said electronic switches, said control inputs of said electronic switches being connected with said switch control means so that each electronic switch can be selectively controlled to be in a first switch position or a second switch position, whereby in said first switch position, the respective output of said first switchboard is switched through to a respective signal drain, and in the second switch position, the respective output of said second switchboard is switched through to the respective signal drain, said switch control means being connected with said common control means via said lines for receiving the addresses identifying the switching points to be switched through and via said individual lines carrying the switchboard addresses for identifying a selected one of said switchboards, said switch control means controlling a respective one of said electronic switches to be moved into a first or second switch position, respectively, depending on whether a connection to be switched through is to be made by way of said first switchboard or by way of said second switchboard.

* * * * *